United States Patent
Zheng

[19]

[11] Patent Number: 6,124,215
[45] Date of Patent: Sep. 26, 2000

[54] APPARATUS AND METHOD FOR PLANARIZATION OF SPIN-ON MATERIALS

[75] Inventor: Jia Zhen Zheng, Singapore, Singapore

[73] Assignee: Chartered Semiconductor Manufacturing Ltd., Singapore, Singapore

[21] Appl. No.: 08/944,504

[22] Filed: Oct. 6, 1997

[51] Int. Cl.$^7$ .................................................. H01L 21/31
[52] U.S. Cl. .............................................. 438/760; 118/52
[58] Field of Search ................................ 438/760; 118/52

[56] References Cited

U.S. PATENT DOCUMENTS

| | | | |
|---|---|---|---|
| 4,794,021 | 12/1988 | Potter | 430/240 |
| 5,302,233 | 4/1994 | Kim et al. | 156/636 |
| 5,312,512 | 5/1994 | Allman et al. | 156/636 |
| 5,454,871 | 10/1995 | Liaw et al. | 118/300 |
| 5,716,673 | 2/1998 | Yen et al. | 438/760 |

OTHER PUBLICATIONS

Stanley Wolf Silicon Processing for the VSLI Era vol. 2 Lattice press p. 232, 1990.

*Primary Examiner*—Charles Bowers
*Assistant Examiner*—David S Blum
*Attorney, Agent, or Firm*—George O. Saile; Rosemary L. S. Pike

[57] ABSTRACT

An improved and new apparatus and process for planarization of spin-on materials has been developed. The key features of the apparatus and the process are an enclosure surrounding the spin-on table and substrate and the application of a planarization pressure plate to the substrate, subsequent to dispersal of the spin-on materials and during rotation of the substrate.

22 Claims, 3 Drawing Sheets

APPARATUS AND METHOD FOR PLANARIZATION OF SPIN-ON MATERIALS

BACKGROUND OF THE INVENTION

(1) Field of the Invention

This invention relates to a method of fabrication used for semiconductor integrated circuit devices, and more specifically to an apparatus and method for planarizing a submicron integrated circuit device using spin-on materials, such as SOG (Spin-On-Glass).

(2) Description of Related Art

The complexity of present-day integrated circuits requires that the devices on silicon wafer substrates shrink to submicron dimensions and the circuit density increases to several million transistors per die. In order to achieve these requirements smaller and smaller feature sizes are needed for both width and spacing of features. Furthermore, as wiring densities in semiconductor circuit chips increase, multiple wiring levels are required to achieve interconnection of the devices, and planarization of the interlevel dielectric becomes a critical step in the fabrication process. Planarized dielectric layers must be formed between metal layers of an integrated circuit in order to achieve good metallization step coverage of the interconnnect metal lines. Also, planarization is necessary to facilitate masking and etching operations. A planarized surface provides a constant depth of focus across the surface for exposing patterns in lithographic layers.

Spin-on dielectric materials, such as SOG (Spin-On-Glass), have been used as the insulating layer between successive interconnection layers. However, complete planarization has not been possible with the application of a single SOG layer. Processes which resort to application of multiple layers of SOG are costly and are subject to higher defect levels. Also, dielectric layers composed of multiple layers are subject to delamination due to poor adhesion between layers. Additional attempts to achieve improved planarization have combined SOG with CMP (Chemical Mechanical Polishing) processes or with plasma etchback processes, but such process combinations suffer from the disadvantages of high expense, low product throughput, and process complexity.

Numerous improvements to methods of forming planarized dielectric layers utilizing SOG have been invented. For example, U.S. Pat. No. 5,312,512 entitled "Global Planarization using SOG and CMP" granted May 17, 1994 to Derryl D. J. Allman et al describes a multiple step process which uses the combination of SOG, etching away higher portions of the SOG layer, and CMP (Chemical Mechanical Polishing) to produce a planarized dielectric surface.

And, U.S. Pat. No. 5,302,233 entitled "Method For Shaping Features of a Semiconductor Struture Using Chemical Mechanical Planarization (CMP)" granted Apr. 12, 1994 to Sung C. Kim et al describes a method of planarizing a dielectric layer, which includes a CMP step using a relatively soft and conforming polishing pad. CMP with the soft pad allows the topography to be contoured. After contouring the topography, additional dielectric material is deposited and planarization is completed by further CMP with a relativley hard polish pad.

Also, U.S. Pat. No. 5,454,871 entitled "SOG Coated Apparatus To Solve SOG Non-Uniformity in the VLSI Process" granted Oct. 3, 1995 to Yung-haw Liaw et al describes an apparatus for applying SOG under controlled humidity conditions. By controlling the humidity during application of SOG the integrity of multiple layers of SOG is improved.

SUMMARY OF THE INVENTION

One object of the present invention is to provide an improved apparatus and method for planarization of spin-on materials.

Another object of the present invention is to provide a new and improved apparatus and process for planarization of SOG (Spin-On-Glass) dielectric layers, which results in superior planarization of the dielectric layer surface.

A further object of the present invention is to provide a new and improved apparatus and process for planarization of SOG dielectric layers, whereby superior planarization is achieved without resorting to costly and time consuming multiple step processing.

In accordance with the present invention, the above and other objectives are realized by using an apparatus for applying spin-on material to a wafer substrate comprising: a spin-on-glass coater spin table with means for holding a wafer substrate onto said spin-on-glass coater spin table; a means of dispensing spin-on material onto the wafer substrate; a means for bringing a plate into symmetrically balanced contact with the wafer substrate during rotation of the wafer substrate; a means of applying a pressure force between the plate and the wafer substrate during rotation of the wafer substrate; a means of controlling the rotary speed of the spin-on-glass coater spin table; a means of controlling the pressure force between the plate and the wafer substrate during rotation of the wafer substrate; and an enclosure comprising a cup and moveable lid assembly which completely cover the spin-on-glass coater spin table.

The method of planarizing a spin-on material applied to a semiconductor wafer substrate having an irregular surface with high and low portions, comprises the steps of: holding the semiconductor wafer substrate onto a spin-on-glass coater spin table; providing an enclosure comprising a cup and moveable lid assembly which completely cover the spin-on-glass coater spin table; dispensing the spin-on material onto the surface of the semiconductor wafer substrate and rotating the semiconductor wafer substrate at a first low rotation speed to disperse the spin-on material across the surface of the semiconductor wafer substrate; after dispersing the spin-on material across the surface of the semiconductor wafer substrate, contacting the surface of the semiconductor wafer substrate with a plate and applying a pressure force between the plate and the semiconductor wafer substrate and rotating the semiconductor wafer substrate at a second rotation speed, the second rotation speed being faster than the first low rotation speed; removing the semiconductor wafer substrate from the spin-on-glass coater spin table;

first heating the spin-on material layer to remove solvents and low-boiling point organic materials; and curing the spin-on layer at a temperature which causes cross-linking of the spin-on material.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved apparatus and method for planarizing a sub-micron integrated circuit device using spin-on materials, such as SOG (Spin-On-Glass), will now be described in detail.

The key features of the new and improved apparatus are: 1) An enclosure comprising a cup and moveable lid assembly which completely cover the spin-on-glass coater spin table. The enclosure prevents excessive evaporation of solvent from the spin-on solution, maintaining fluidity of the spin-on solution during dispersal across the surface of the semiconductor wafer substrate, and thus enhancing the filling of gaps. 2) A means for bringing a plate into symmetrically balanced contact with the wafer substrate during rotation of the wafer substrate and a means of applying a pressure force between the plate and the wafer substrate during rotation of the wafer substrate. The plate, which may be either in the form of a bar or a disk, and the applied force between the plate and the wafer substrate following the dispersion of spin-on solution across the surface of the semiconductor wafer surface cause superior planarization of the spin-on material. The advantages of the invention will become apparent in the detailed descriptions of the preferred embodiments. Only the specific areas unique to understanding this invention will be described in detail.

Figure 1:
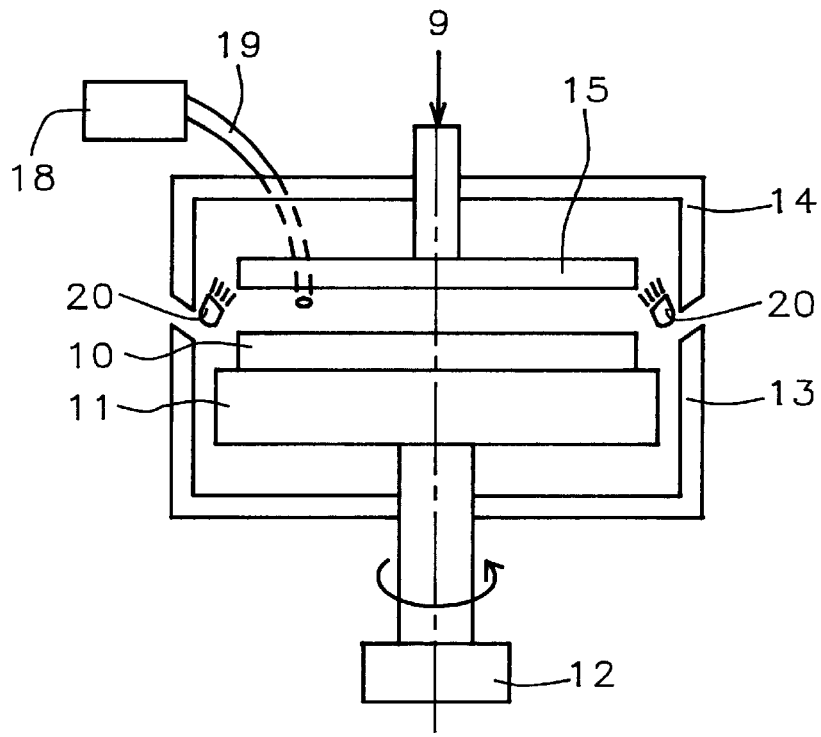
FIG. 1, which schematically, in cross-sectional representation, illustrates the apparatus of the present invention.
Figure 2:
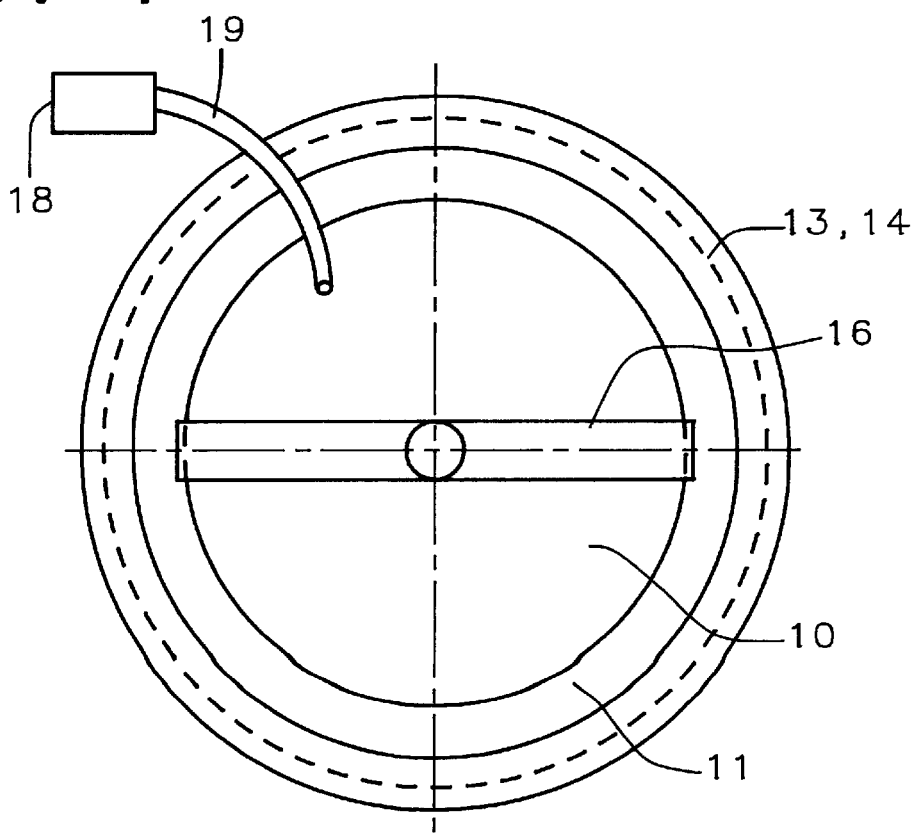
FIGS. 2 and 3, which schematically in top-view illustrate a first and second embodiment of the present invention.
Figure 3:
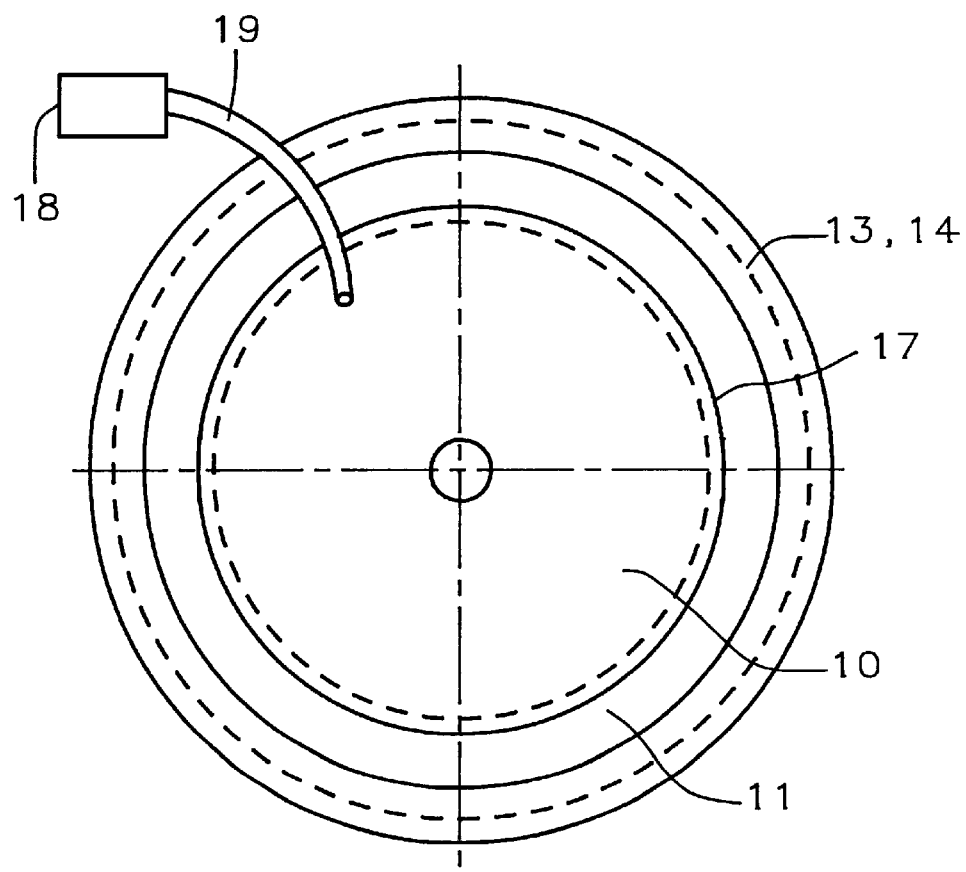

FIG. 1, schematically, in cross-sectional representation illustrates the apparatus of the invention. A semiconductor wafer substrate, 10, is placed upon a conventional rotatable spin-on-glass spin table, 11. A motor and speed control assembly, 12, can cause rotation of the spin table, 11. As is conventional, the spin table, 11, includes a means of holding the substrate onto the spin table. Such means is usually by application of vacuum through holes or grooves in the surface of the spin table. An enclosure comprising a cup, 13, and a moveable lid, 14, completely covers the spin-on-glass spin table, 11, and semiconductor wafer substrate, 10, when the moveable lid, 14, is placed onto the cup, 13. A moveable plate, 15, is schematically shown in a raised position, but the moveable plate, 15, may be brought into contact with the surface of the semiconductor wafer substrate, 10, through application of a pressure force, 9. Pressure force, 9, may be controlled in the range between about 0.1 and 3.0 psi. The shape of plate, 15, may be either a bar or a disk as schematically illustrated in FIGS. 2 and 3, which are top views of the apparatus. It is desirable that the bar, 16, have a length equal to or slightly longer than the diameter of the semiconductor wafer substrate, 10.

Also, the disk, 17, should have a diameter equal to or slightly larger than the diameter of the semiconductor wafer substrate, 10. Also, included in the apparatus are spin-on material reservoir, 18, and conduit, 19, for dispensing spin-on material onto the surface of semiconductor wafer substrate, 10. The spin-on material may be spin-on-glass of either a siloxane or silicate type suspended in a solvent.

Other spin-on materials may also, be employed. Spray nozzles, 20, are used to direct a cleaning solvent onto the surfaces of plate, 15, to effect cleaning of the plate following contact of the plate, 15, with spin-on material dispersed on the surface of the semiconductor wafer substrate.

Figure 4:
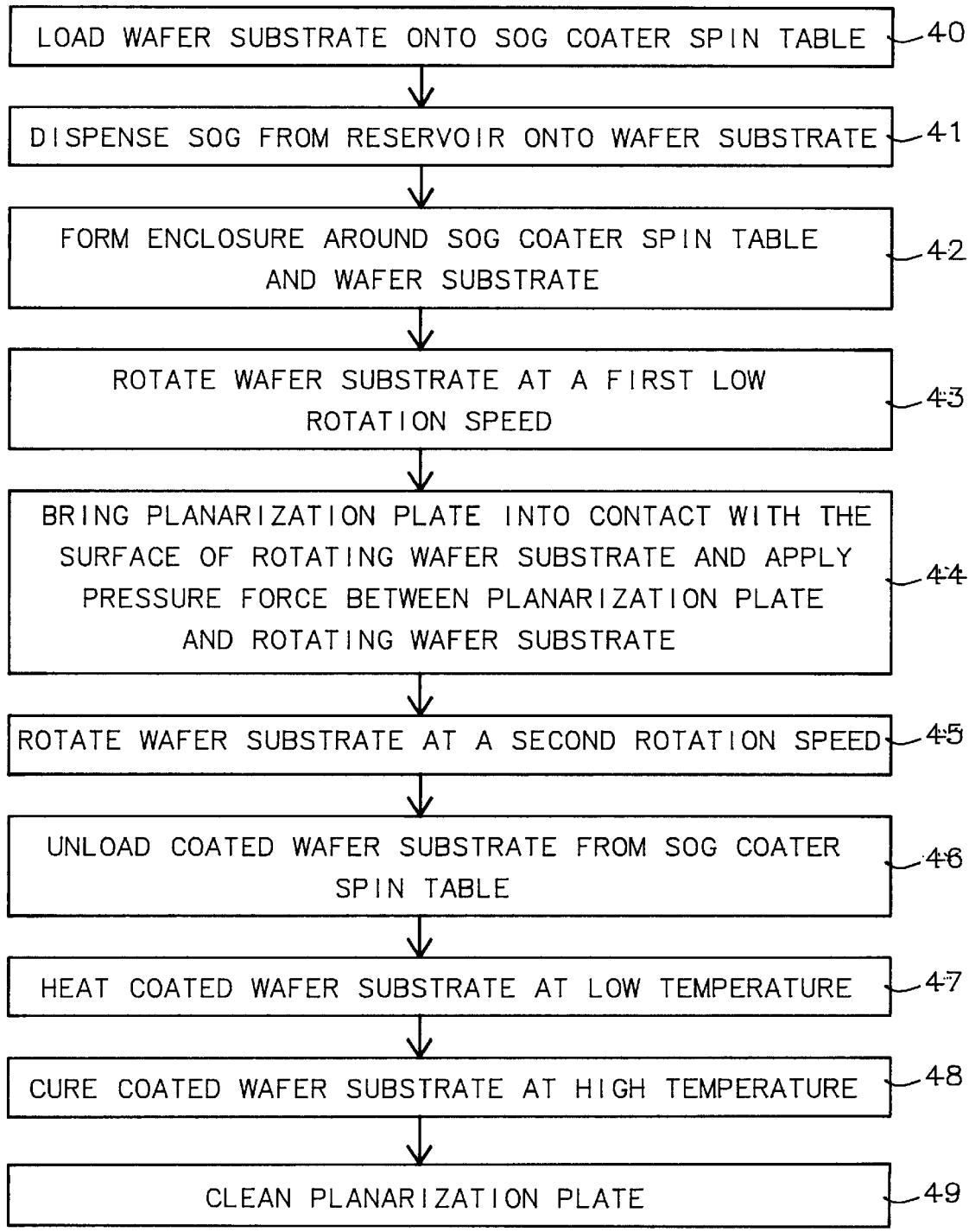
FIG. 4, which is flow chart of the method of the preferred embodiment of the present invention.

The new and improved method of planarizing a spin-on material applied to a semiconductor wafer substrate having an irregular surface with high and low portions is shown in FIG. 4, which is flow chart of the method of the preferred embodiment of the present invention. Referring to FIGS. 1 and 4, Step 40 loads the semiconductor wafer substrate, 10, onto the spin-on-glass coater spin table, 11. Step 41 dispenses spin-on-glass from reservoir, 18, through conduit, 19, onto semiconductor wafer substrate, 10. Step 42 closes the moveable lid, 14, onto the cup, 13, to form an enclosure around the spin-on-glass coater spin table, 11, and semiconductor wafer substrate, 10. The purpose of the enclosure is to prevent or minimize the evaporation of solvent from the spin-on-glass solution during dispersal of the spin-on-glass across the surface of the semiconductor wafer substrate. Prevention of excessive evaporation of solvent from the spin-on solution maintains the fluidity of the spin-on-glass solution during dispersal across the surface of the semiconductor wafer substrate, and thus enhances the filling of gaps. Step 43 rotates the semiconductor wafer substrate at a first low rotation speed to disperse the spin-on-glass across the surface of semiconductor wafer substrate. Step 44 brings moveable plate, 15, into contact with the surface of rotating semiconductor wafer substrate, 10, having spin-on-glass dispersed thereon, and applies a pressure force between the moveable plate, 15, and the semiconductor wafer substrate, 10. In the preferred embodiment the moveable plate, 15, is a bar having a length equal to or slightly longer than the diameter of the semiconductor wafer substrate and the applied presure is in a range between about 0.1 and 3.0 psi. Step 45 increases the speed of rotation of the semiconductor wafer substrate to a second rotation speed having a range between about 300 and 3000 rpm, while maintaining the applied pressure force between the moveable plate and the semiconductor wafer substrate. Rotation of the semiconductor wafer substrate at the second rotation speed is for a time between about 5 and 60 sec. Step 46 unloads the coated semiconductor wafer substrate from the spin coating apparatus. Step 47 heats the coated substrate with a low temperature bake to remove solvents and low-boiling point organic materials. The coated substrate is heated, for example, in a range of temperature between about 100 and 300° C. for a time between about 0.5 and 3.0 min. Step 48 is a high temperature curing step performed in a temperature range between about 250 and 450° C. for a time between about 10 and 120 min. The curing step, performed in nitrogen or other inert gas, causes cross-linking and densification of the spin-on-glass. The curing step is preferably at least about 30 min. Step 49 is an optional cleaning operation which directs a cleaning solvent from spray nozzles, 20, onto the surfaces of plate, 15, to effect cleaning of the plate following contact of the plate, 15, with spin-on material dispersed on the surface of the semiconductor wafer substrate. The solvent may be isopropyl alcohol (IPA) or other suitable cleaning agent.

The advantages of the present invention are shown by comparing various planarization processes utilizing spin-on-glass to coat a metallization pattern having lines and gaps where the thickness of the metallization is about 6000 Angstroms. Coating of the metallization pattern with spin-on-glass in a conventional spin-on-glass apparatus, followed by conventional heating and curing, produces a step height reduction to >5000 Angstroms. Coating of the metallization pattern with spin-on-glass on a spin table enclosed within a cup and moveable lid, followed by conventional heating and curing, produces a step height reduction to >4000 Angstroms. Coating of the metallization pattern with spin-on-glass with the apparatus of the present invention containing the key features of an enclosure around the spin table and substrate and the application of a planarization pressure bar with applied pressure of 1.0 psi, subsequent to dispersal of the spin-on-glass and during rotation of the substrate, produces a step height reduction to <2000 Angstroms, following heating at a temperature of 200° C. for 1.0 min. and high temperature curing at 400° C. for 30 min. This marked improvement in planarization, as indicated by the step height reduction after applying a single coating of SOG, demonstrates the advantages of the apparatus and method of the present invention.

While the invention has been particularly shown and described with reference to the preferred embodiments thereof, it will be understood by those skilled in the art that various changes in form and details may be made without departing from the spirit and scope of the invention.

What is claimed is:

1. A method of planarizing a spin-on material applied to a semiconductor wafer substrate having an irregular surface with high and low portions, the method comprising the steps of:

holding said semiconductor wafer substrate onto a spin-on-glass coater spin table;

providing an enclosure comprising a cup and moveable lid assembly which completely cover said spin-on-glass coater spin table;

dispensing said spin-on material onto the surface of said semiconductor wafer substrate and rotating said semiconductor wafer substrate at a first low rotation speed to disperse the spin-on material across the surface of the semiconductor wafer substrate;

after dispersing the spin-on material across the surface of the semiconductor wafer substrate, contacting the surface of the semiconductor wafer substrate with a plate and applying a pressure force between the plate and the semiconductor wafer substrate and rotating said semiconductor wafer substrate at a second rotation speed, said second rotation speed being faster than said first low rotation speed;

and then removing said semiconductor wafer substrate from the spin-on-glass coater spin table;

and then first heating the spin-on material layer to remove solvents and low-boiling point organic materials; and and then curing the spin-on layer at a temperature which causes cross-linking of the spin-on material.

2. The method of claim 1, wherein said spin-on material is spin-on-glass.

3. The method of claim 1, wherein said first low rotation speed is between about 50 and 500 rpm.

4. The method of claim 1, wherein said plate comprises a bar having a length equal to or slightly longer than the diameter of said semiconductor wafer substrate.

5. The method of claim 4, wherein said pressure force between said bar and said semiconductor wafer substrate is in a range between about 0.1 and 3.0 psi.

6. The method of claim 1, wherein said plate comprises a circular disk having a diameter equal to or slightly larger than the diameter of said semiconductor wafer substrate.

7. The method of claim 6, wherein said pressure force between said disk and said semiconductor wafer substrate is in a range between about 0.1 and 3.0 psi.

8. The method of claim 1, wherein said second rotation speed is between about 300 and 3000 rpm.

9. The method of claim 1, wherein said first heating is at a temperature between about 100 and 300° C. for a time between about 30 and 180 sec.

10. The method of claim 1, wherein said curing is at a temperature between about 250 and 450° C. for a time between about 10 and 120 min.

11. A method of forming a planarized dielectric layer on a semiconductor wafer substrate having an irregular surface with high and low portions, the method comprising the steps of:

providing a semiconductor wafer substrate having patterned conducting lines formed on the semiconductor wafer substrate with gaps formed between the conducting lines;

holding said semiconductor wafer substrate onto a spin-on-glass coater spin table;

providing an enclosure comprising a cup and moveable lid assembly which completely cover said spin-on-glass coater spin table;

dispensing said spin-on material onto the surface of said semiconductor wafer substrate and rotating said semiconductor wafer substrate at a first low rotation speed to disperse the spin-on material across the surface of the semiconductor wafer substrate;

after dispersing the spin-on material across the surface of the semiconductor wafer substrate, contacting the surface of the semiconductor wafer substrate with a plate and applying a pressure force between the plate and the semiconductor wafer substrate and rotating said semiconductor wafer substrate at a second rotation speed, said second rotation speed being faster than said first low rotation speed;

and then removing said semiconductor wafer substrate from the spin-on-glass coater spin table;

and then first heating the spin-on material layer to remove solvents and low-boiling point organic materials; and and then curing the spin-on layer at a temperature which causes cross-linking of the spin-on material.

12. The method of claim 11, wherein said patterned conducting lines comprise aluminum having a thickness between about 4000 and 10,000 Angstroms.

13. The method of claim 11, wherein said gaps formed between the conducting lines have a width between 1000 and 10,000 Angstroms.

14. The method of claim 11, wherein said spin-on material is spin-on-glass.

15. The method of claim 11, wherein said first low rotation speed is between about 50 and 500 rpm.

16. The method of claim 11, wherein said plate comprises a bar having a length equal to or slightly longer than the diameter of said semiconductor wafer substrate.

17. The method of claim 16, wherein said pressure force between said bar and said semiconductor wafer substrate is in a range between about 0.1 and 3.0 psi.

18. The method of claim 11, wherein said plate comprises a circular disk having a diameter equal to or slightly larger than the diameter of said semiconductor wafer substrate.

19. The method of claim 18, wherein said pressure force between said disk and said semiconductor wafer substrate is in a range between about 0.1 and 3.0 psi.

20. The method of claim 11, wherein said second rotation speed is between about 300 and 3000 rpm.

21. The method of claim 11, wherein said first heating is at a temperature between about 100 and 300° C. for a time between about 30 and 180 sec.

22. The method of claim 11, wherein said curing is at a temperature between about 250 and 450° C. for a time between about 10 and 120 min.

* * * * *